United States Patent [19]

Bickley et al.

[11] Patent Number: 4,673,886

[45] Date of Patent: Jun. 16, 1987

[54] ADAPTIVELY STABILIZED RF AMPLIFIER

[75] Inventors: Robert H. Bickley, Scottsdale; Robin D. Culver, Tempe, both of Ariz.

[73] Assignee: Motorola, Inc., Schaumburg, Ill.

[21] Appl. No.: 833,291

[22] Filed: Feb. 26, 1986

[51] Int. Cl.⁴ .............................................. H03F 1/52
[52] U.S. Cl. ................................. 330/298; 330/145; 330/149; 330/207 P; 330/284; 455/117
[58] Field of Search ............ 330/138, 145, 149, 207 P, 330/280, 284, 298; 455/117, 249; 361/88, 91; 307/318, 321, 547, 548, 551, 559, 561

[56] References Cited

U.S. PATENT DOCUMENTS

| | | | |
|---|---|---|---|
| 2,774,866 | 12/1956 | Burger | 330/284 X |
| 2,860,196 | 11/1958 | Schultz | 330/298 |
| 3,022,421 | 2/1962 | Nygaard et al. | 455/249 X |
| 3,345,570 | 10/1967 | Matyckas | 455/117 X |
| 3,424,993 | 1/1969 | Clar | 330/298 |
| 3,428,909 | 2/1969 | Kam et al. | 330/276 |
| 4,024,463 | 5/1977 | Pelley | 330/138 |
| 4,439,741 | 3/1984 | Turner, Jr. | 330/284 X |

FOREIGN PATENT DOCUMENTS 137513   9/1979   Fed. Rep. of Germany ...... 330/298

Primary Examiner—James B. Mullins
Attorney, Agent, or Firm—Lowell W. Gresham

[57] ABSTRACT

An output transistor of an RF power amplifier remains stable so that it does not generate subharmonic spurious outputs. An adaptive stabilization network maintains the stability of the output by decreasing the impedance presented to the output transistor when voltage levels at the output transistor exceed a predetermined level. A combination consisting of a peak detector coupled to a Zener diode senses the predetermined level. A PIN diode couples to the Zener diode and to the output transistor so that the PIN diode becomes forward biased when the predetermined level is exceeded.

17 Claims, 1 Drawing Figure

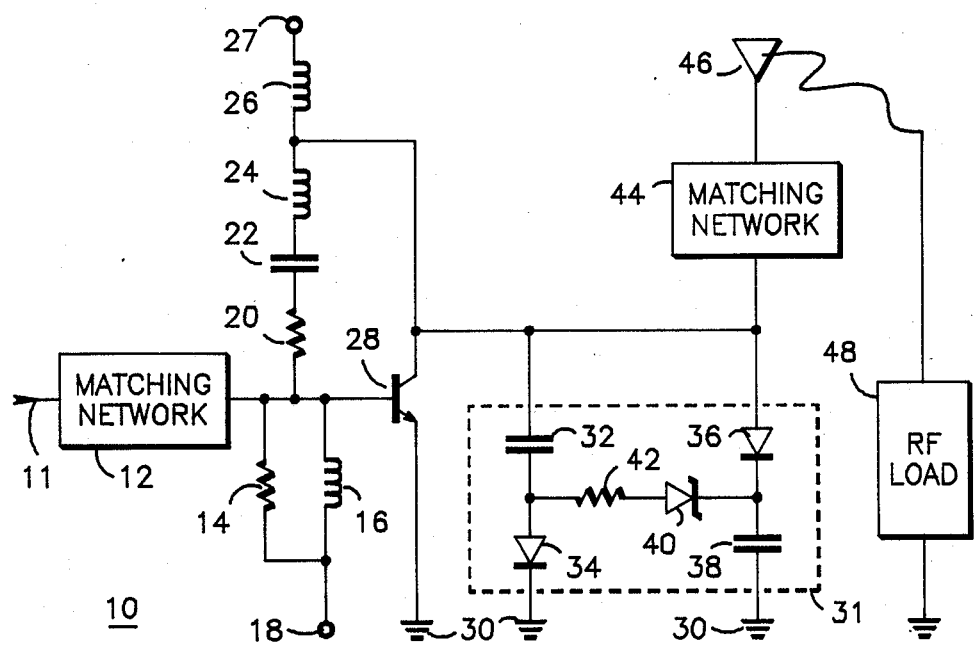

4,673,886

ADAPTIVELY STABILIZED RF AMPLIFIER

BACKGROUND OF THE INVENTION

This invention relates generally to the stabilization of radio frequency (RF) power amplifiers. Specifically, the present invention prevents the generation of subharmonic spurious outputs in RF power amplifiers.

An output stage of an RF power amplifier may become unstable when it drives a severely mismatched load. A severely mismatched load condition may result from poor antenna or cable connections, broken or otherwise faulty antennas, or proximity of the antenna to electrically conductive surfaces. When this severe mismatch occurs, amplifiers often exhibit an instability in which spurious frequencies are produced. The spurious frequencies may be submultiples, such as one-half, of the fundamental RF output frequency.

RF amplifiers often utilize a transistor in a common emitter configuration for the output stage. The spurious frequencies occur as a result of the output transistor's collector-base diode becoming momentarily forward biased. The output transistor's collector-base diode is reverse biased under normal operating conditions, but may become forward biased when a severe mismatch condition causes the impedance reflected to the output transistor's collector to increase. Resultingly, collector voltage increases, and negative excursions of the collector voltage are so low that the collector-base diode of the output transistor becomes temporarily forward biased.

The forward biasing of the collector-base diode momentarily causes a storage of electrical charge carriers which alters the output transistor's gain parameters. Consequently, the output transistor amplifies a subsequent cycle of an RF signal to a lesser degree than it amplified a previous cycle. The lesser amplified cycle does not cause negative excursions of the collector voltage to forward bias the collector-base diode. Thus, stored charges may clear by the end of the lesser amplified cycle. After the stored charges clear, the greater amplified cycle repeats, causing the output transistor's collector-base diode to become forward biased again. This process continuously repeats causing an undesirable spurious output at a subharmonic of the fundamental RF.

Severe cases in which this subharmonic instability occurs may damage the output transistor. Prior art circuits which protect the output transistor tend to reduce the subharmonic instability in severe cases, but are not effective in reducing spurious outputs generally. Some prior art circuits reduce the amount of power delivered to a mismatched load. The usefulness of the transmitter is severely impaired since it does not deliver the maximum stable RF power it is capable of delivering.

Other prior art circuits sense the amount of power being reflected from an antenna back to an output transistor. Such circuits do not prevent the occurrence of spurious emissions when severe mismatch conditions cause very little power to be delivered to the antenna in the first place.

Other prior art circuits reduce the level of a signal driving the output transistor. Such circuits typically utilize a complex control loop which limits control of the drive signal to the response time of the loop. Due to slow response times, some types of spurious outputs, such as may occur from a loose or intermittent connection, cannot be prevented.

SUMMARY OF THE INVENTION

Accordingly, it is an object of the present invention to provide an improved, stabilized RF power amplifier in which the impedance at a collector node of an output transistor decreases to maintain stability of the RF power amplifier. By reducing the impedance driven by the collector of an output transistor, collector voltage excursions likewise decrease. The decreased collector voltage excursions prevent the forward biasing of the collector-base diode within the output transistor and therefore maintain power amplifier stability. Accordingly, the power amplifier may continue to deliver useful power to an antenna without producing spurious outputs.

Another object of the present invention concerns providing a circuit which couples to the collector of an output transistor and adapts the impedance driven by the collector of the output transistor to given RF load conditions. For example, the adaptive circuit should exert only an insubstantial effect on the amplifier output signal when no stability problems exist.

Yet another object of the present invention concerns providing a circuit which operates in a substantially instantaneous manner to decrease the impedance driven by the collector of an output transistor. As a result, spurious outputs may be prevented even though they may be caused by intermittent antenna or cabling connections.

Still another object of the present invention concerns providing a circuit which protects an output transistor from excessive voltage.

The above and other objects and advantages of the present invention are carried out in one form by a stabilized amplifier which has an output transistor. The output transistor couples to a voltage level sensing means and to an impedance decreasing means. The impedance decreasing means further couples of the voltage level sensing means so that the impedance decreasing means is controlled by the voltage level sensing means.

BRIEF DESCRIPTION OF THE DRAWING

A more complete understanding of the present invention may be derived by reference to the detailed description and claims when considered in connection with the accompanying drawing wherein the sole FIGURE shows a schematic diagram of the preferred embodiment of the present invention.

DETAILED DESCRIPTION OF THE PREFERRED EMBODIMENT

The sole FIGURE shows an output stage of a power amplifier 10. A terminal 11 receives an RF input signal. The RF input signal may have passed through other amplification stages within power amplifier 10 prior to being applied at terminal 11. Terminal 11 couples to an input port of an impedance matching network 12. Any one of many matching networks known to those skilled in the art may satisfactorily operate in the present invention, depending upon the particular application. Thus, matching network 12 need not be described in detail herein. An output port of matching network 12 connects to a base node of an NPN transistor 28.

Transistor 28 represents an output transistor of power amplifier 10. An emitter of transistor 28 connects to a terminal 30, which is adapted to receive a common potential such as ground. A collector of transistor 28 represents an output node of output transistor 28. The collector of transistor 28 connects to a first node of a shunt inductor 26, and a second node of shunt inductor 26 connects to a terminal 27, which is adapted to receive a positive supply voltage. In the preferred embodiment the supply voltage applied at terminal 27 is a positive 14 volts DC nominal.

A resistor 20, a capacitor 22, and an inductor 24 couple together in series with one another. Further, the network consisting or resistor 20, capacitor 22, and inductor 24 couples between the collector and the base of transistor 28. Resistor 20, capacitor 22, and inductor 24 provide feedback which enchances the stability of transistor 28.

First nodes of a resistor 14 and an inductor 16 additionally couple to the base of transistor 28. Second nodes of resistor 14 and inductor 16 couple together and to a terminal 18. Terminal 18 is adapted to receive a positive DC voltage which is suitable for biasing transistor 28.

In the preferred embodiment power amplifier 10 operates in the UHF band. Thus, transistor 28 operates at frequencies greater than 200 MHz. Further, in the preferred embodiment transistor 28 can withstand collector-to-emitter voltage levels up to 45 volts.

The collector, or output node, of transistor 28 couples to an input port of a matching network 44. An output port of matching network 44 couples to an antenna 46. Antenna 46 couples to an RF load 48.

RF load 48 represents the environment in which antenna 46 operates. Consequently, RF load 48 presents a typical impedance to power amplifier 10 at antenna 46 when antenna 46 operates with a typical environment. Using techniques known to those skilled in the art, power amplifier 10 is designed to properly operate in conjunction with this typical RF load impedance. Thus, impedance matching network 44 is designed to pass electrical energy from the output node of transistor 28 to the typical RF load impedance. Any one of many different impedance matching networks known to those skilled in the art may satisfactorily serve as matching network 44, depending upon the application.

However, RF load 48 presents an impedance to power amplifier 10 which may vary widely from the typical RF load impedance. For example, a broken or otherwise faulty antenna 46, or the proximity of antenna 46 to a large electrically conductive surface (not shown) can cause the impedance of RF load 48 to change. As a result matching network 44, which is designed to operate with a typical RF load, ineffectively passes energy to RF load 48. A portion of the energy reflects back from antenna 46, through matching network 44, to the collector of transistor 28. A VSWR build-up at the collector of transistor 28 results.

An adaptive stabilization network 31 couples between the collector of transistor 28 and ground 30. Specifically, an anode of a diode 36 couples to the collector of transistor 28, and a cathode of diode 36 couples to a cathode of a Zener diode 40 and a first node of a storage capacitor 38. A second node of capacitor 38 couples to ground 30. An anode of Zener diode 40 couples to a first node of a resistor 42, and a second node of resistor 42 couples to an anode of a PIN diode 34 and a first node of a DC blocking capacitor 32. A second node of capacitor 32 couples to the collector of transistor 28, and a cathode of PIN diode 34 couples to ground 30.

Diode 36, capacitor 38, and Zener diode 40 cooperate to sense when the voltage level at the collector of transistor 28 exceeds a predetermined level. When this predetermined voltage level is exceeded, Zener diode 40 breaks down and conducts a biasing current through resistor 42 and PIN diode 34 to ground 30. When PIN diode 34 conducts this biasing current to ground 30, it exhibits a relatively low impedance to the RF signal at the collector of transistor 28. However, when PIN diode 34 does not conduct this biasing current, it presents a relatively high impedance to the RF signal at the collector of transistor 28. Accordingly, PIN diode 34 represents a decreasing impedance which couples to the collector of transistor 28. PIN diode 34 decreases in impedance in response to the electrical components which detect when the voltage at the collector of transistor 28 exceeds a predetermined level.

Of particular advantage to the ability of PIN diode 34 to stabilize power amplifier 10 is the fact that PIN diode 34 exhibits a substantially resistive impedance which decreases as forward bias current increases through PIN diode 34. Since a resistance without significant reactive components couples to transistor 28, stability occurs as the load impedance and peak voltage swing are reduced by the pin diode resistive loading.

Diode 36 and capacitor 38 together form a peak detector. In the preferred embodiment diode 36 represents a hot-carrier, or schottky barrier, type diode and is therefore suitable for operation at UHF frequencies. Diode 36 conducts current whenever the voltage level of the RF signal at the collector of transistor 28 exceeds the voltage level of the charge stored in capacitor 38 by the diode-drop value of diode 36. Until Zener diode 40 begins to break down, capacitor 38 charges to a voltage level which approximates the peak value of the total dc plus RF voltage at the collector of transistor 28.

Capacitor 38 exhibits a capacitance value which permits capacitor 38 to supply forward biasing current to PIN diode 34 without the voltage level across capacitor 38 significantly dropping over a single cycle of RF energy. On the other hand, capacitor 38 is small enough to respond quickly to changing VSWR conditions at the collector of transistor 28. In the preferred embodiment, capacitor 38 represents a 10pf capacitor which charges to the peak value of the signal at the collector of transistor 28 in approximately 10RF cycles. Once capacitor 38 charges to this peak value, it presents a high impedance to the RF signal at the collector of transistor 28.

In the preferred embodiment Zener diode 40 breaks down at approximately a reverse voltage of 33 volts. So long as the VSWR at the collector of transistor 28 causes capacitor 38 to exhibit a voltage less than this 33 volt breakdown voltage, Zener diode 40 does not break down, and PIN diode 34 does not conduct a biasing amount of current. Thus, PIN diode 34 exhibits a relatively large resistance which couples through capacitor 32 to the collector of transistor 28.

As those skilled in the art will recognize, Zener diode 40 exhibits a leakage current. However, in the preferred embodiment, the leakage current of Zener diode 40 remains less than the value of current required to bias PIN diode 34 in an ON state. Accordingly, PIN diode 34 remains in an OFF state until Zener diode 40 begins to break down. Those skilled in the art will recognize that a resistor (not shown) may be added in parallel with PIN diode 34 to permit greater leakage currents by Zener diode 40.

Resistor 42 represents a current limiting resistor. Thus, resistor 42 limits the rate of discharge from capacitor 38 when Zener diode 40 breaks down. The resistance value for resistor 42 represents a compromise. This value is as large as possible so that smaller capacitance values for capacitor 38 may be used. However, this value is also as small as possible so that sufficient forward biasing current flows through PIN diode 34 in the ON state to permit PIN diode 34 to effectively reduce the impedance at the collector of transistor 28. In the preferred embodiment resistor 42 exhibits 2K ohms.

Capacitor 32 represents a DC blocking capacitor which has little effect on the impedance presented to the collector of transistor 28 at UHF frequencies. PIN diode 34 exhibits a relatively low capacitance value and a relatively high resistance value, such as 10K ohms, when PIN diode 34 is biased in the OFF state. Thus, when PIN diode 34 is in the OFF state, it has only an insubstantial effect on the impedance presented to the collector of transistor 28.

Accordingly, output transistor 28 drives a total load which consists of two sub-loads physically coupled in parallel. A first sub-load includes impedance matching network 44, antenna 46, and RF load 48. Output transistor 28 continuously drives this first sub-load. A second sub-load consists of adaptive stabilization network 31. Adaptive stabilization network 31 exerts substantially no influence on the total load until the second sub-load is electrically applied through the switching of PIN diode 34 to the ON state. Adaptive stablization network 31 decreases the total load at the collector of transistor 28 by electrically coupling a substantially resistive PIN diode between the collector of transistor 28 and ground 30. Since impedance decreases, the VSWR likewise decreases. By decreasing the VSWR, the collector-base diode of transistor 28 may remain reverse biased so that transistor 28 maintains stability and refrains from generating subharmonic spurious outputs.

Adaptive stabilization network 31 adapts to a given RF load condition. When RF load 48 exhibits a typical or near typical impedance, capacitor 38 does not charge to a voltage level which causes Zener diode 40 to break down. PIN diode 34 remains in the OFF state. Consequently, adaptive stablization network 31 has only an insubstantial effect on the impedance at the collector of transistor 28 because PIN diode 34 in the OFF state and fully charged capacitor 38 both present high impedances to the collector of transistor 28.

When RF load 48 exhibits a severely atypical impedance value, capacitor 38 charges to a voltage level which causes Zener diode 40 to break down. As Zener diode 40 begins to break down, a feedback control loop forms. Greater VSWR build-ups at the collector of transistor 28 cause greater voltage charges at capacitor 38. A greater voltage charge across capacitor 38 causes Zener diode 40 to conduct a greater amount of current as it breaks down, and PIN diode 34 exhibits a lesser resistance as a result. The lesser resistance lowers the VSWR build-up at the collector of transistor 28. Accordingly, bias current through PIN diode 34 adaptively seeks a current level which causes PIN diode 34 to exhibit a resistance so that maximum power is delivered by antenna 46 without causing spurious outputs.

Additionally, adaptive stablization network 31 operates in a substantially instantaneous manner to reduce the impedance presented at the collector of transistor 28. Capacitor 38 fully charges in a few cycles of RF energy. Accordingly, PIN diode 34 exhibits the ON state within a few cycles of RF energy after the occurrence of a mismatched load condition.

The foregoing description uses a preferred embodiment to illustrate the present invention. However, those skilled in the art will recognize that changes and modifications may be made in this embodiment without departing from the scope of the present invention. For example, the specific values and polarities described above may be changed to adapt the present invention to different applications. These and other changes and modifications obvious to those skilled in the art are intended to be included within the scope of this invention.

What is claimed is:

1. A stabilized RF amplifier having an output transistor with an output node, a matching network, and an antenna, the matching network being coupled between said transistor output node and the antenna, the amplifier comprising:
    means, coupled between the output node of said output transistor and the matching network, for detecting a predetermined voltage level at the output node of said transistor; and
    means, coupled to the output node of said output transistor and to said detecting means, for decreasing impedance presented to the output node of said output transistor, said impedance decreasing means being controlled by said detecting means.

2. A stabilized amplifier as claimed in claim 1 wherein said impedance decreasing means decreases impedance at the output node of said output transistor by decreasing a resistive component of a substantially resistive load.

3. A stabilized amplifier as claimed in claim 1 wherein said impedance decreasing means comprises:
    a blocking capacitor having a first node coupled to the output node of said output transistor and having a second node; and
    a PIN diode having a first node coupled to the second node of said blocking capacitor and to said detecting means, and a second node coupled to a terminal adapted to receive a common potential.

4. A stabilized amplifier as claimed in claim 1 wherein said detecting means comprises:
    a first diode having first and second nodes, the first node of said first diode being coupled to the output node of said transistor;
    a capacitor coupled between the second node of said first diode and a terminal adapted to receive a common potential; and
    a Zener diode having a first node, the first node of said Zener diode being coupled to the second node of said first diode.

5. A stabilized amplifier as claimed in claim 4 wherein said first diode is a hot-carrier diode.

6. A stabilized amplifier as claimed in claim 4 wherein said Zener diode has a second node and said impedance decreasing means comprises a PIN diode having first and second nodes, the first node of said PIN diode being coupled to the second node of said Zener diode, and the second node of said PIN diode being coupled to the terminal which is adapted to receive the common potential.

7. A stabilized amplifier as claimed in claim 6 wherein said impedance decreasing means comprises a DC blocking capacitor having first and second nodes, the first node of said DC blocking capacitor being coupled to the output node of said transistor, and the second node of said DC blocking capacitor being coupled to the first node of said PIN diode.

8. A stabilized amplifier as claimed in claim 6 additionally comprising a current limiting resistor coupled between the second node of said Zener diode and the first node of said PIN diode.

9. A stabilized amplifier as claimed in claim 8 wherein said Zener diode and said PIN diode are configured so that:
   said PIN diode exhibits a first resistance when said PIN diode conducts a current which substantially equals a leakage current of said Zener diode;
   said PIN diode exhibits a second resistance when said PIN diode conducts no current; and
   the first resistance substantially equals the second resistance.

10. A stabilized amplifier as claimed in claim 9 wherein said PIN diode is configured so that said PIN diode exhibits a first capacitance value when said PIN diode conducts a current substantially equivalent to the leakage current of said Zener diode, and the first capacitance value causes only an insubstantial effect on impedance at the output node of the output transistor.

11. A method of maintaining stability in an RF power amplifier having an output transistor with an output node and a first load which includes a matching network and an antenna, the matching network being coupled between the transistor output node and the antenna, the method comprising the steps of:
   sensing voltage at the output node of the output transistor of the power amplifier, said sensing occurring across the first load; and
   applying a second load to the output node of the output transistor when said sensing step indicates that the voltage at the output node of the output transistor exceeds a predetermined level.

12. A method as claimed in claim 11 additionally comprising the step of decreasing the impedance of said second load in response to an increase in the voltage at the output transistor above the predetermined level.

13. A method as claimed in claim 11 wherein said applying step operates substantially instantaneously when said sensing step indicates that the voltage at the output transistor exceeds the predetermined level.

14. A method as claimed in claim 11 additionally comprising the step of selecting the second load of said applying step to be a substantially resistive impedance.

15. An adaptively stabilized RF amplifier having an output transistor with an output node, a matching network, and an antenna, the matching network being coupled between the transistor output node and the antenna, the amplifier comprising:
   a first diode having a first node coupled to the output node of the output transistor and having a second node;
   a storage capacitor having a first node coupled to the second node of said first diode and having a second node;
   a Zener diode having a first node coupled to the second node of said first diode and having a second node;
   a blocking capacitor having a first node coupled to the first node of said first diode and having a second node coupled to the second node of said Zener diode; and
   a PIN diode having a first node coupled to the second node of said Zener diode and having a second node coupled to the second node of said storage capacitor.

16. An adaptively stablized RF amplifier as claimed in claim 15 wherein:
   the first and second nodes of said first diode represent an anode and a cathode, respectively;
   the first and second nodes of said Zener diode represent a cathode and an anode, respectively; and
   the first and second nodes of said PIN diode represent an anode and a cathode, respectively.

17. An adaptively stabilized RF amplifier as claimed in claim 15 additionally comprising a current limiting resistor having a first node coupled to the second node of said Zener diode and having a second node coupled to the first node of said PIN diode and to the second node of said blocking capacitor.

* * * * *